United States Patent [19]

Birkett

[11] Patent Number: 5,410,518

[45] Date of Patent: Apr. 25, 1995

[54] ULTRASONIC TRANSDUCER ASSEMBLY FOR MEASURING LIQUID LEVEL

[75] Inventor: Robert E. Birkett, Shelburne, Vt.

[73] Assignee: Simmonds Precision Product, Inc., Akron, Ohio

[21] Appl. No.: 152,997

[22] Filed: Nov. 12, 1993

[51] Int. Cl.⁶ ............................................. G01F 23/28
[52] U.S. Cl. ...................................... 367/87; 367/908; 73/290 V
[58] Field of Search ................... 367/88, 87, 908, 165; 73/290 V

[56] References Cited

U.S. PATENT DOCUMENTS 5,120,578  6/1992  Chen et al. ........................... 427/304
5,142,142  8/1992  Senechalle et al. ............. 250/227.23
5,309,763  5/1994  Sinclair ................................ 367/908

Primary Examiner—Ian J. Lobo
Attorney, Agent, or Firm—Carl A. Rankin; William E. Zitelli

[57] ABSTRACT

A transducer assembly for an ultrasonic liquid level measuring device utilizing a piezoelectric crystal for generating ultrasonic pulses to be transmitted through a volume of liquid. The assembly includes an enclosure for the piezoelectric crystal assembly, that defines an interior space and a sealed opening for a cable. The enclosure is provided with a metallic layer that shields the entire interior space from electromagnetic interference. The assembly also includes a crystal housing assembly and a terminal block all located within the sealed enclosure.

15 Claims, 4 Drawing Sheets

ULTRASONIC TRANSDUCER ASSEMBLY FOR MEASURING LIQUID LEVEL The U.S. Government has a paid-up license in this invention and the right in limited circumstances to require the patent owner to license others on reasonable terms as provided for by the terms of Contract No. F 33657-91-C-0006 awarded by Air Force Systems Command.

BACKGROUND OF THE INVENTION

The invention is concerned with ultrasonic measuring systems and especially those that utilize an ultrasonic transducer for sending and receiving ultrasonic signals that are directed through a volume of liquid in a container to measure the level of the liquid. More particularly, the invention relates to a housing for the transducer assembly and related components, all of which must be located in a sealed enclosure to be emersed in the liquid.

Ultrasonic measuring systems are commonly used to measure the level of liquid in containers such as fixed storage tanks, fuel storage reservoirs and aircraft fuel tanks. These systems generally use a tubular probe or stillwell inserted approximately vertically in the tank. An ultrasonic transducer transmits a sinusoidal acoustical pulse through the stillwell to the surface of the liquid. An echo returns from the surface of the liquid to the transducer and provides a sinusoidal echo signal. A receiver responds to the echo signal and the total elapsed time is then determined. Thus, further data is calculated for display.

In these systems, a transducer assembly containing a piezoelectric crystal is usually connected to the stillwell at or near the bottom of the tank. Accordingly, the various components should be mounted in a sealed enclosure to prevent intrusion of liquid. Also, it is necessary to provide a means to pass a cable through the sealed enclosure to provide electrical current for the piezoelectric crystal.

One problem with these types of systems is that of eliminating the effects of electromagnetic interference (EMI) that could adversely effect the measurements obtained by the device.

Still another problem is that of securing the enclosure that contains the piezoelectric crystal and other components to the body of the stillwell at the desired location with the piezoelectric device positioned correctly at the end of the tube so as to direct the ultrasonic pulse along the axis of the stillwell.

The transducer enclosure of the present invention reduces the problems described above and affords other features and advantages heretofore not obtainable.

SUMMARY OF THE INVENTION

The present invention is concerned with a transducer assembly for an ultrasonic liquid level measuring device that includes a piezoelectric crystal for generating ultrasonic pulses to be transmitted through a volume of liquid and a cable for supplying voltage excitation to the crystal. The invention provides an enclosure for the piezoelectric crystal assembly and the circuit elements described. The enclosure defines an interior space and a sealed opening for the cable. The interior walls of the enclosure are provided with a metallic layer to block electromagnetic interference from the interior space. The assembly also includes a transducer housing adapted to support the piezoelectric crystal assembly and a terminal block secured to the transducer housing to form an integral member that is securely positioned in the enclosure. The terminal block is adapted to support the terminals that are connected to the cable.

DESCRIPTION OF THE PREFERRED EMBODIMENT

Figure 1:
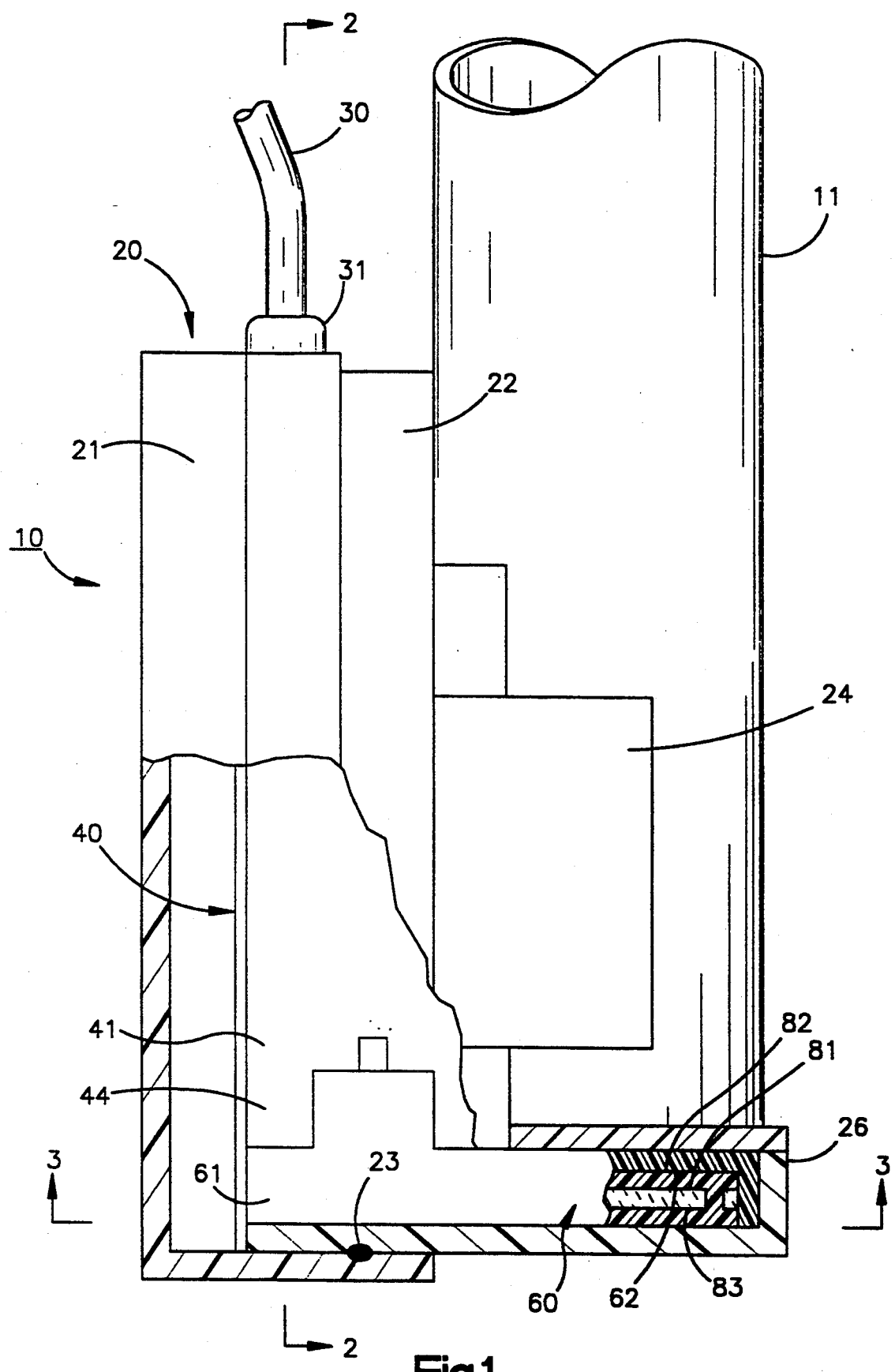
FIG. 1 is an elevational view showing a transducer assembly embodying the invention mounted in association with a stillwell for measuring the fuel level in an aircraft fuel tank and with parts broken away and shown in section.
Figure 2:
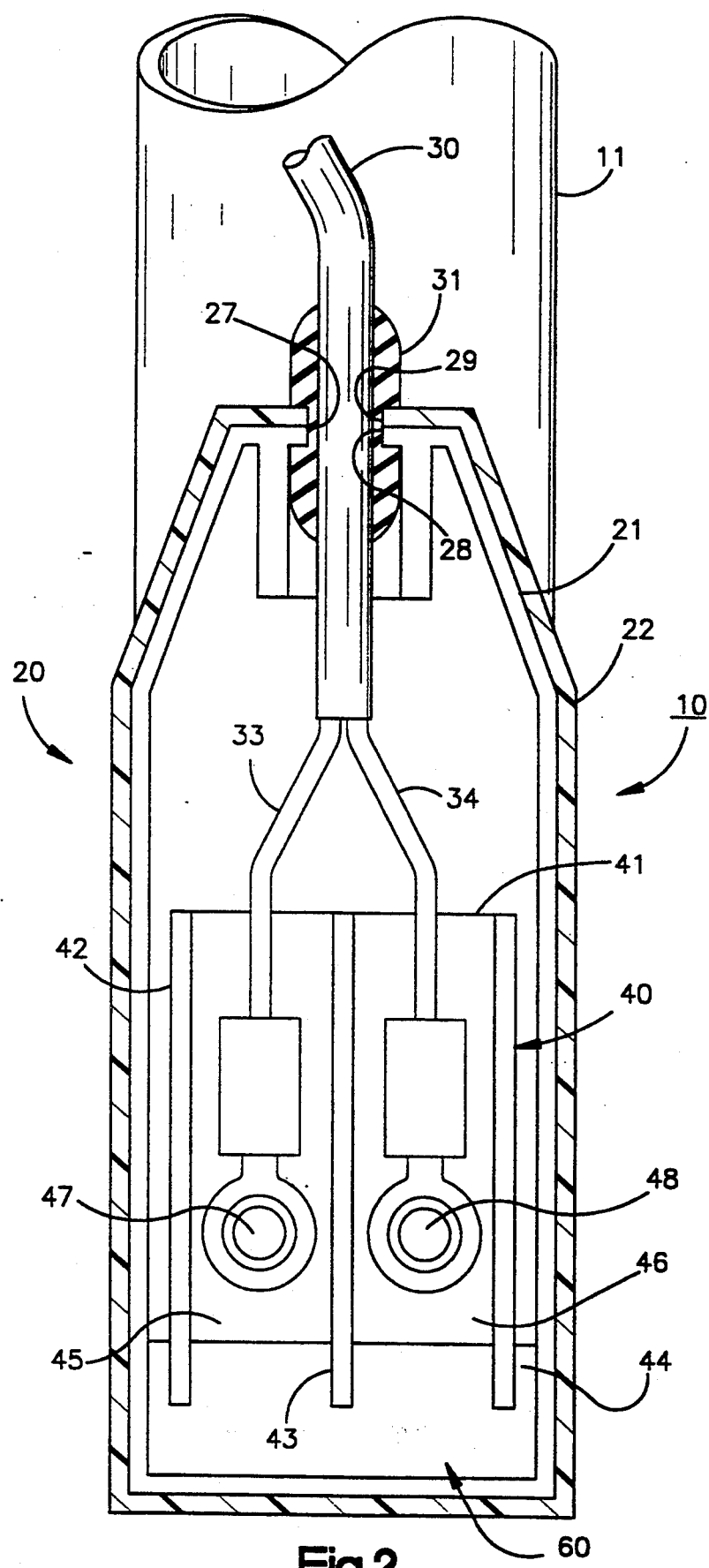
FIG. 2 is a side elevation taken from the line 2—2 of FIG. 1 with parts broken away and shown in section for the purpose of illustration.
Figure 3:
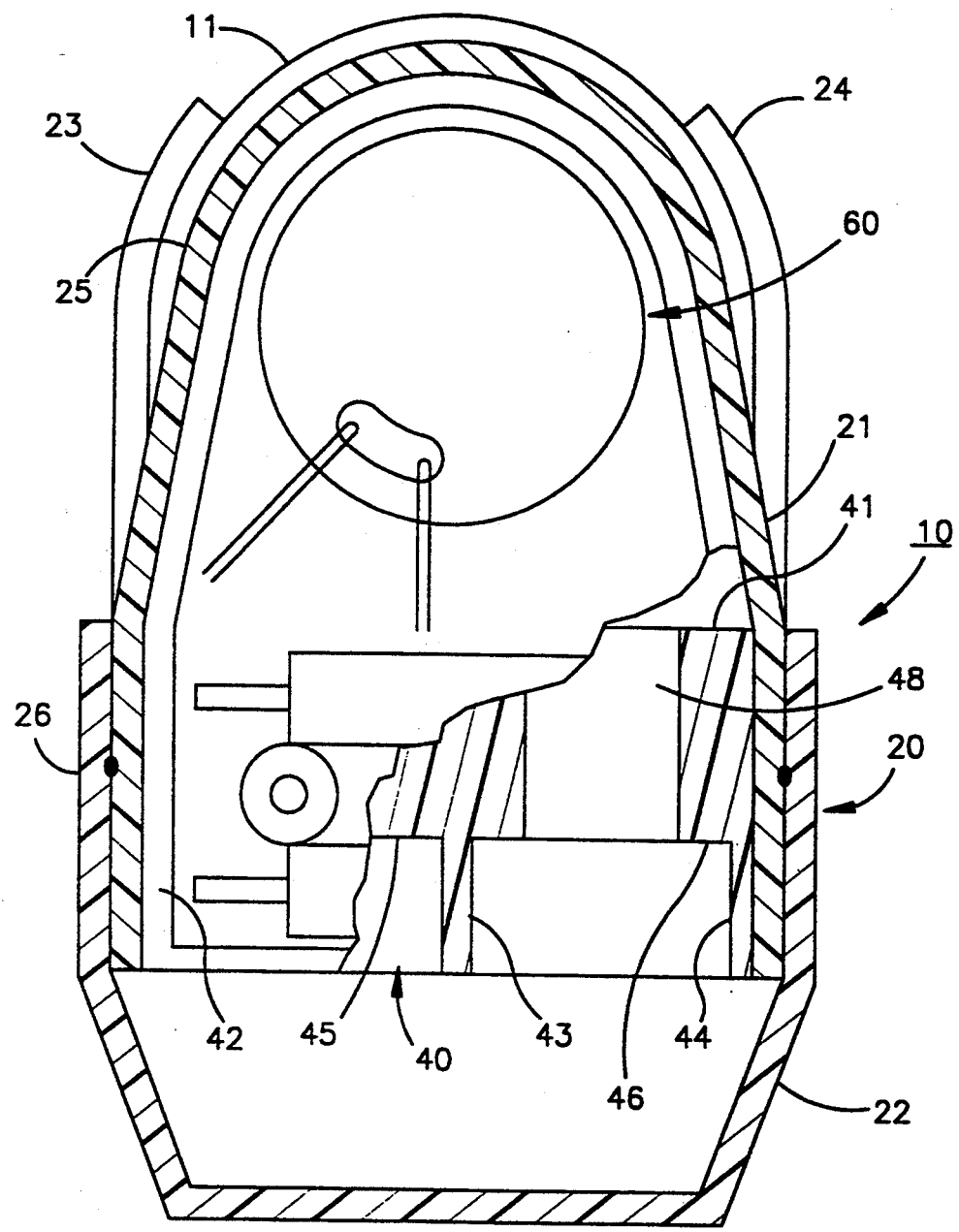
FIG. 3 is an end elevational view from below taken on the line 3—3 of FIG. 1.

Referring more particularly to the drawings, there is shown a transducer assembly 10 mounted at the bottom of a tubular probe or a stillwell 11 that is typically used in an aircraft fuel tank. The stillwell is inserted approximately vertically in the tank. The purpose of the stillwell is to provide a liquid column that represents the level in the entire fuel tank but which is not subject to turbulence and other influences that could adversely effect the measurement.

An ultrasonic transducer located in the transducer assembly 10, transmits a sinusoidal acoustical pulse through the stillwell 11 to the surface of the liquid. An echo returns from the surface of the liquid to the transducer and provides a sinusoidal echo signal. A receiver responds to the echo signal so that the total elapsed time from transmission to reception may be determined. Since the elapsed time is a function of the height of the column of liquid in the stillwell, the level of fluid in the tank may be readily determined using techniques well known to those skilled in the art. The calculated data may then be displayed.

The transducer assembly 10 includes as its principal components an enclosure 20, a power cable 30, a terminal block assembly 40 and a crystal housing assembly 60.

The enclosure 20 includes a main housing 21 and a cover 22 both formed of a suitable plastic material. The housing and cover, when assembled, define an interior space in which the various components of the transducer assembly are mounted.

Because the assembly 10 is emersed in a fuel tank, it is necessary that the enclosure be tightly sealed to prevent intrusion of the fuel into the interior.

Also, the cover 22 is removably secured to the main housing 21 to permit convenient removal if access to the interior components is required.

The main housing 21, is provided with a pair of laterally extending arms 23 and 24 that have a curved configuration, the curve being defined by an arc centered at a longitudinal axis between the two arms. The arms 23 and 24 are used to secure the transducer assembly 10 to the stillwell 11 in the manner shown in FIG. 1. The arms are flexible and resilient so that the enclosure 20 need be merely pressed against the wall of the stillwell 11 to flex the arms outwardly sufficiently to permit the enclosure to be moved into position. Then the arms flex inwardly to grip the stillwell and provide a secure connection. It will be noted that this arrangement permits the transducer assembly to be quickly secured and removed from the stillwell as necessary.

The main housing 21 also has a laterally extending portion 25 in which the crystal housing assembly 60 is mounted and which is adapted to be placed at the bottom open end of the stillwell 11 in a position so that an ultrasonic pulse generated by the transducer assembly 60 may be directed upwardly along the axis of the stillwell to the surface of the liquid.

In accordance with the invention, the interior surfaces of the enclosure 20 are coated or plated with metallic material to shield the interior components from electromagnetic interference which is often present in an aircraft fuel tank environment.

The conductive shielding for the enclosure 20 is accomplished by coating the parts with electroless copper followed by electroless nickel for corrosion resistance. The main housing 21 and cover 22 are preferably coated on both sides although conductive coating on one side only would produce sufficient shielding. Coating the entire inside and outside surfaces, however, is simpler and less costly. To provide shield continuity between the main housing member and the cover, a raised contact strip 26 is provided on the engaging surfaces of the main housing.

Figure 4:
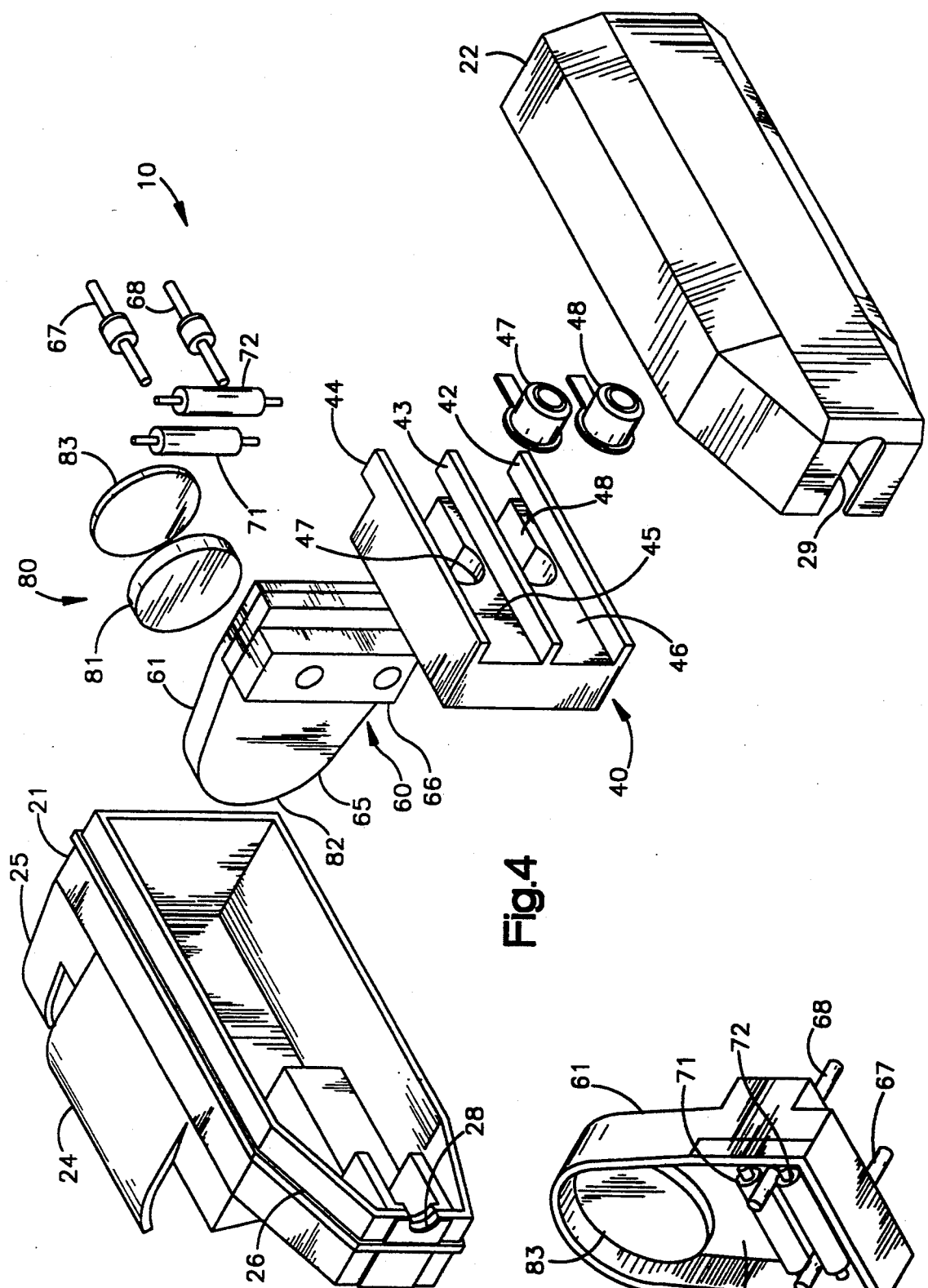
FIG. 4 is an exploded perspective view showing the various components of the transducer assembly of the invention.
Figure 5:
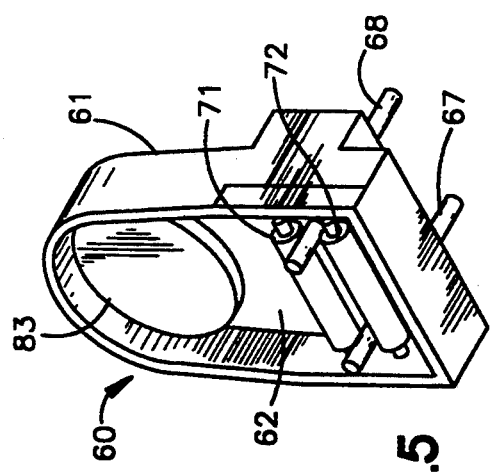
FIG. 5 is a perspective view showing the crystal subassembly of the transducer assembly of the invention.

It will be seen from FIG. 4, that when the main housing 21 and cover 22 are assembled, they define an opening 27 for the power cable 30. The opening is formed by means of a semi-circular cut-out 28 formed in the main housing 21 and a slot 29 formed in the cover 22. When the cover and main housing are assembled, the inner end of the slot 29 and the cut-out 28 define the circular opening 27.

The cable 30 extends through a ferrule 31 to provide strain relief and a tight seal. The ferrule 31 fits tightly in the opening 27 and is in fact electrically bonded to the metallic plating around its entire circumference. Also, the ferrule 31 is preferably formed of an electrically conductive material so as to extend the electromagnetic interference shield through the space it fills in the opening 27. The cable has a pair of conductors 33 and 34 to provide current to the crystal as will to be described below.

The terminal block assembly 40 includes a molded member 41 formed of a suitable plastic material and having three parallel walls 42, 43 and 44 that serve to define a pair of channels 45 and 46. The channels have openings formed in the floor thereof that extend through the block. A pair of terminal elements 47 and 48 are mounted in the openings and are adapted to receive the conductors 33 and 34 from the cable 30.

The crystal housing assembly 60 is received, for the most part, in the extending portion 25 of the main housing 21 and is intended to provide a secure mount for the crystal assembly 80. The housing assembly includes a housing block 61 preferably formed of molded plastic material. The block has a relatively flat shape with a parametric sidewall that defines a recess 62. The recess 62 has a floor 63 with a pair of openings 65 and 66 formed therein. The openings 65 and 66 are adapted to receive a pair of electromagnetic interference filters 67 and 68 that extend axially therethrough.

The floor 63 also has a circular well 70 formed therein adapted to receive and support the crystal assembly 80° Also a pair of resistors 71 and 72 are mounted in the recess 62. The resistors are connected in parallel with the electrodes for the crystal assembly 80 to provide a redundant charge drain path.

The crystal assembly 80 includes a piezoelectric crystal 81 which may be, for example, a lead-zirconate-titanate piezoelectric ceramic in the form of a disc with electrodes on each face to produce a roughly planar compressive wave. The crystal 81 is acoustically matched to the fuel by means of a quarter-wave-thickness face plate or window 82 with acoustic impedance chosen for optimum energy transfer.

The quarter-wave construction also minimizes internal vibrations to provide maximum resolution and accuracy. The rearward side of the crystal is acoustically isolated for maximum sensitivity and to prevent emission of sound from the bottom of the transducer and subsequent false echoes from the tank bottom. The isolation is provided by means of a back piece 83.

The crystal is adhesively bonded to the face plate 82. Acoustic transparency of the bond is attained by suitable flatness of the surfaces, extensive cleaning, application of primer to the electrode surface, degassing of the adhesive and curing under uniform pressure.

The piezoelectric crystal 81 is inherently weak mechanically in tension but strong in compression. To make optimum use of this property, the transducer is designed to surround the crystal with window material symmetrically so as to minimize stresses in the crystal due to differential thermal expansion of the crystal and window material. This minimisation of stress is achieved by the crystal assembly 80 described above consisting of the window 82 and backing plate 83. These are adhesively bonded around the crystal 81 with an angled joint (FIG. 1) designed to minimize adhesive stresses.

A pair of electrodes 85 and 86 from the bonded face are brought to the opposite face to facilitate electrical connection. A tab on the bonded face is flattened to match the electrode surface. Also, the electrical connections to the crystal may be made with conductive adhesive to protect the crystal from damage from soldering heat.

The backing plate 83 has a relief for acoustical isolation and has a passage for the electrical leads. Accordingly, the backing plate 83 is not dimensionally symmetrical to the window 82 but is sized to be mechanically symmetrical in its stiffness and thermal expansion characteristics.

The crystal assembly 80 is inserted into the crystal housing assembly 60 and secured in place with conductive adhesive to ensure shield continuity.

The terminal block assembly 40 and the crystal housing assembly 60 are bonded together before assembly into the main housing member 21. It will be seen with reference FIG. 4 that the assembly of the two components 40 and 60 can easily be accomplished to form an integral unit that may then be inserted in the main housing 21 and bonded in position. Then the leads 33 and 34 from the power cable may be connected to the terminals 49 and 50. After this, the cover 22 may be secured to the main housing 21 to complete the assembly. This arrangement provides a transducer assembly with substantial shielding against electromagnetic interference to improve the accuracy of the ultrasonic liquid level measuring system.

While the invention has been shown and described with respect to a specific embodiment thereof, this is for the purpose of illustration rather than limitation and other variations and modifications of the specific device herein shown and described will be apparent to those skilled in the art all within the intended spirit and scope of the invention. Accordingly, the patent is not to be limited in scope and effect to the specific embodiment herein shown and described nor in any other way that is inconsistent with the extent to which the progress in the art has been advanced by the invention.

I claim:

1. In combination, a transducer assembly for an ultrasonic liquid level measuring device that includes a piezoelectric crystal for generating ultrasonic pulses to be transmitted through a volume of liquid and a power cable for supplying current to said piezoelectric crystal, and a stillwell, having a longitudinal axis, adapted to contain a portion of said volume, said transducer assembly comprising:

enclosure means defining an interior space and an opening through which said power cable extends;

a transducer housing removably mounted in said enclosure means and in which said piezoelectric crystal is supported, said transducer housing being adapted to position said piezoelectric crystal at the bottom of said stillwell to direct ultrasonic pulses along said stillwell axis, a terminal block secured within said transducer housing, terminal means mounted in said terminal block, said power cable being connected to said terminal means; and a metallic layer applied to at least the interior surfaces of said enclosure means and said transducer housing to block electromagnetic interference from said interior space whereby said ultrasonic pulses are directed through said metallic layer.

2. A transducer assembly as defined in claim 1, including means for providing a seal between said power cable and the edges of said opening.

3. A transducer assembly as defined in claim 2, wherein said sealing means comprises a tubular ferrule formed of electrically conductive material and having a portion thereof bonded to said metallic layer.

4. A transducer assembly as defined in claim 1, wherein said enclosure means includes means for attaching said assembly to a stillwell.

5. A transducer assembly as defined in claim 4, wherein said attaching means comprises a pair of flexible resilient arms extending outwardly from said enclosure and adapted to flex outwardly during attachment and to move into a holding position to surround and grip said stillwell therebetween.

6. A transducer assembly as defined in claim 1, wherein said enclosure means includes a main housing member and a cover adapted to be secured to said main housing member after said transducer housing and said terminal block have been positioned in said main housing members.

7. A transducer assembly as defined in claim 1, wherein said piezoelectric crystal is assembled in combination with a window element and a back plate, said window having an acoustic impedance with efficient energy transfer characteristics and said back plate being adapted to isolate said crystal from undesired acoustic echoes.

8. A transducer assembly as defined in claim 7, wherein said crystal is secured between said window element and said back plate by adhesive bonding, the circumferential portions of said window element and said back plate extending radially outward beyond the circumference of said crystal and being in engagement with one another at an angled joint to minimize stresses in said crystal due to differential thermal expansion.

9. In combination, a transducer assembly for an ultrasonic liquid level measuring device that includes a piezoelectric crystal for generating ultrasonic pulses to be transmitted through a volume of liquid and a power cable for supplying current to said piezoelectric crystal; and a stillwell having a longitudinal axis, adapted to contain a portion of said volume, said transducer assembly comprising;

enclosure means defining an interior space and an opening through which said power cable extends, housing means removably mounted in said enclosure means and in which said piezoelectric crystal is supported, said housing means adapted to position said piezoelectric crystal at the bottom of said stillwell to direct ultrasonic pulses along said stillwell axis, conductor means within said housing operatively connected between said power cable and said piezoelectric crystal and shielding means applied to at least the interior surfaces of said enclosure means to block electromagnetic interference from said interior space whereby said ultrasonic pulses are directed through said shielding means.

10. A transducer assembly as defined in claim 9, wherein said shielding means comprises a metallic layer applied to surfaces of said enclosure means.

11. A transducer assembly as defined in claim 10, wherein said metallic layer is applied to the interior surfaces of said enclosure means.

12. A transducer assembly as defined in claim 9, wherein said conductor means includes a terminal means secured within said housing, said power cable being operatively connected to said terminal means.

13. A transducer assembly as defined in claim 9, wherein said enclosure means includes a main housing member and a cover adapted to be secured tightly secured to said main housing member.

14. A transducer assembly as defined in claim 10, wherein said piezoelectric crystal is assembled in combination with a window element and a back plate, said window having an acoustic impedance with efficient energy transfer characteristics and said back plate being adapted to isolate said crystal from undesired acoustic echoes.

15. A transducer assembly as defined in claim 14, wherein said crystal is secured between said window element and said back plate by adhesive bonding, the circumferential portions of said window element and said back plate extending radially outward beyond the circumference of said crystal and being in engagement with one another at an angled joint to minimize stresses in said crystal due to differential thermal expansion.

* * * * *